(12) United States Patent
Kim et al.

(10) Patent No.: US 11,625,116 B2
(45) Date of Patent: Apr. 11, 2023

(54) DISPLAY DEVICE

(71) Applicant: SAMSUNG DISPLAY CO., LTD., Yongin-si (KR)

(72) Inventors: Jae-Kyoung Kim, Hwaseong-si (KR); Ki Seo Kim, Yongin-si (KR); Eun Jin Sung, Yongin-si (KR); Bong Hyun You, Seoul (KR); Won Sang Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/694,074

(22) Filed: Mar. 14, 2022

(65) Prior Publication Data
US 2022/0197425 A1    Jun. 23, 2022

Related U.S. Application Data

(63) Continuation of application No. 17/009,379, filed on Sep. 1, 2020, now Pat. No. 11,275,463.

(30) Foreign Application Priority Data

Oct. 31, 2019    (KR) .................. 10-2019-0138147

(51) Int. Cl.
*G06F 3/041*    (2006.01)
*H01L 27/32*    (2006.01)
(Continued)

(52) U.S. Cl.
CPC .......... *G06F 3/0412* (2013.01); *H01L 27/323* (2013.01); *H01L 27/3223* (2013.01);
(Continued)

(58) Field of Classification Search
CPC .. H01Q 1/36; H01Q 1/22; H01Q 1/44; H01Q 21/0006; H01Q 21/065; H01Q 1/38;
(Continued)

(56) References Cited

U.S. PATENT DOCUMENTS 9,740,340 B1    8/2017    Rosenberg et al.
9,859,616 B2    1/2018    Ikeda et al.
(Continued)

FOREIGN PATENT DOCUMENTS

CN    101952115    1/2011
CN    112394824    2/2021
(Continued)

OTHER PUBLICATIONS

European Search Report dated Mar. 10, 2021 issued in corresponding European Patent Application No. 20197651.1.

*Primary Examiner* — Vinh T Lam
(74) *Attorney, Agent, or Firm* — F. Chau & Associates, LLC

(57) ABSTRACT

A display device includes: a base substrate including a touch area and a non-touch area adjacent to the touch area and including a first area and a second area; a touch electrode disposed in the touch area and including a lattice pattern; an antenna electrode disposed in the first area and including a lattice pattern; a first dummy pattern disposed in the first area; and a second dummy pattern disposed in the second area, wherein the second area is disposed between the first area and the touch area, and the lattice pattern of the touch electrode includes openings that are larger than openings of the lattice pattern of the antenna electrode.

20 Claims, 11 Drawing Sheets

(51) Int. Cl.
*H01L 51/52* (2006.01)
*H01Q 1/36* (2006.01)

(52) U.S. Cl.
CPC ...... *H01L 27/3225* (2013.01); *H01L 27/3244* (2013.01); *H01L 51/5253* (2013.01); *H01Q 1/36* (2013.01)

(58) Field of Classification Search
CPC ....... G06F 3/0412; G06F 1/16; H01L 27/323; H01L 27/3225; H01L 51/5253; H01L 27/3244; H01L 27/3223
See application file for complete search history.

(56) References Cited

U.S. PATENT DOCUMENTS

| | | | |
|---|---|---|---|
| 10,481,638 B2 * | 11/2019 | Yoshizumi | .......... H04M 1/0268 |
| 10,622,703 B2 | 4/2020 | Hong et al. | |
| 10,985,450 B2 * | 4/2021 | Yamagishi | .......... G06F 3/04162 |
| 2011/0273382 A1 * | 11/2011 | Yoo | ........................ G06F 3/041 |
| | | | 345/173 |
| 2012/0050975 A1 | 3/2012 | Garelli et al. | |
| 2013/0162594 A1 | 6/2013 | Paulsen et al. | |
| 2016/0328057 A1 | 11/2016 | Chai et al. | |
| 2017/0139520 A1 * | 5/2017 | Yeh | ........................ H01Q 9/30 |
| 2017/0237152 A1 | 8/2017 | Lee et al. | |
| 2018/0113528 A1 | 4/2018 | Xi et al. | |
| 2018/0314369 A1 | 11/2018 | Yashiro et al. | |
| 2019/0220123 A1 | 7/2019 | Kanaya | |
| 2019/0361549 A1 | 11/2019 | Gu | |
| 2020/0379607 A1 | 12/2020 | Oh et al. | |
| 2021/0103354 A1 * | 4/2021 | Kim | ....................... G06F 1/1643 |
| 2021/0132714 A1 | 5/2021 | Dan et al. | |
| 2021/0132722 A1 | 5/2021 | Kim et al. | |

FOREIGN PATENT DOCUMENTS

| | | | |
|---|---|---|---|
| EP | 3171258 | 5/2017 | |
| EP | 3171258 A1 * | 5/2017 | .......... G06F 3/0416 |
| JP | 3382487 | 3/2003 | |
| JP | 4814223 | 10/2006 | |
| KR | 20170116160 | 10/2017 | |
| KR | 10-2019-0019802 | 2/2019 | |
| KR | 10-1971490 | 4/2019 | |
| KR | 10-1973742 | 4/2019 | |
| KR | 10-2019-0089515 | 7/2019 | |
| KR | 10-2031203 | 10/2019 | |
| KR | 20200071354 | 6/2020 | |
| KR | 102167154 | 10/2020 | |
| KR | 20200134673 | 12/2020 | |
| KR | 20210009657 | 1/2021 | |
| KR | 102225521 | 3/2021 | |
| KR | 102225522 | 3/2021 | |
| KR | 102225523 | 3/2021 | |
| WO | 2010099132 | 9/2010 | |
| WO | 2016185993 | 11/2016 | |
| WO | 2017131128 | 8/2017 | |
| WO | WO-2018159926 A1 * | 9/2018 | .......... G06F 3/04182 |

* cited by examiner

DISPLAY DEVICE

CROSS-REFERENCE TO RELATED APPLICATIONS

This application is a continuation of U.S. patent application Ser. No. 17/009,379 filed on Sep. 1, 2020, which claims priority under 35 USC § 11.9 to Korean Patent Application No. 10-2019-0138147 filed on Oct. 31, 2019 in the Korean Intellectual Property Office (KIPO), the disclosures of which are incorporated by reference herein in their entireties.

TECHNICAL FIELD

Embodiments of the present inventive concept relate generally to a display device. More particularly, embodiments of the present inventive concept relate to a display device having an antenna electrode.

DISCUSSION OF THE RELATED ART

Conventional cathode ray tube (CRT) televisions have been widely used for display devices due to their performance and price. Display devices such as a plasma display device, a liquid crystal display device, and an organic light emitting display device have been increasing used because, when compared to a CRT, these display apparatuses provide increased miniaturization or portability, are light in weight and have relatively low power consumption.

An electronic apparatus including the display device may include an antenna to perform a communication function. As an area occupied by the display device increases in the electronic apparatus, signal loss and signal blocking may become severe due to the structure of the antenna provided in the electronic apparatus.

Accordingly, there have been efforts to position the antenna on a display area of the display device. However, display quality has been impacted due the positioning of the antenna in the display area.

SUMMARY

According to an embodiment of the present inventive concept, a display device includes: a base substrate including a touch area and a non-touch area adjacent to the touch area and including a first area and a second area; a touch electrode disposed in the touch area and including a lattice pattern; an antenna electrode disposed in the first area and including a lattice pattern; a first dummy pattern disposed in the first area; and a second dummy pattern disposed in the second area, wherein the second area is disposed between the first area and the touch area, and the lattice pattern of the touch electrode includes openings that are larger than openings of the lattice pattern of the antenna electrode.

In an embodiment of the present inventive concept, the first dummy pattern includes lattice pattern, and the second dummy pattern includes a lattice pattern.

In an embodiment of the present inventive concept, the base substrate further includes a third area disposed between the second area and the touch area, and wherein the display device further comprises a third dummy pattern disposed in the third area and including a lattice pattern having a size or a shape different from a size or a shape of the lattice pattern of the second dummy pattern.

In an embodiment of the present inventive concept, the lattice pattern of the second dummy pattern includes openings that are larger than openings of the lattice pattern of the first dummy pattern, and the lattice pattern of the third dummy pattern includes openings that are larger than the openings of the lattice pattern of the second dummy pattern.

In an embodiment of the present inventive concept, the openings of the lattice pattern of the antenna electrode each have a size smaller than or equal to a size of the openings of the lattice pattern of the first dummy pattern, and the openings of the lattice pattern of the touch electrode each have a size greater than or equal to a size of the openings of the lattice pattern of the third dummy pattern.

In an embodiment of the present inventive concept, the lattice pattern of the touch electrode has a first quadrangular shape, wherein the lattice pattern of the antenna electrode has a second quadrangular shape having four sides of substantially a same length, wherein the lattice pattern of the first dummy pattern has a third quadrangular shape having four sides of substantially a same length, and the lattice pattern of the second dummy pattern has a fourth quadrangular shape having four sides of substantially a same length.

In an embodiment of the present inventive concept, the second quadrangular shape of the lattice pattern of the antenna electrode forms a vertex angle smaller than about 90 degrees, wherein the third quadrangular shape of the lattice pattern of the first dummy pattern forms a first vertex angle smaller than about 90 degrees and greater than or equal to the vertex angle of the second quadrangular shape, and wherein the fourth quadrangular shape of the lattice pattern of the second dummy pattern forms a second vertex angle smaller than about 90 degrees and greater than the first vertex angle.

In an embodiment of the present inventive concept, one side of the first quadrangular shape of the lattice pattern of the touch electrode has a length greater than a length of one side of the fourth quadrangular shape of the lattice pattern of the second dummy pattern, wherein one side of the third quadrangular shape of the lattice pattern of the first dummy pattern has a length smaller than or equal to the length of the one side of the fourth quadrangular shape of the lattice pattern of the second dummy pattern, and wherein one side of the second quadrangular shape of the lattice pattern of the antenna electrode has a length smaller than or equal to the length of the one side of the fourth quadrangular shape of the lattice pattern of the second dummy pattern.

In an embodiment of the present inventive concept, the first dummy pattern has a first litre width, and the second dummy pattern has a second line width greater than the first line width.

In an embodiment of the present inventive concept, a line width of the lattice pattern of the antenna electrode is smaller than or equal to the first line width, and a line width of the lattice pattern of the touch electrode is greater than the second line width.

In pan embodiment of the present inventive concept, the antenna electrode and the touch electrode are spaced apart from each other.

In an embodiment of the present inventive concept, the base substrate further includes a peripheral area adjacent to the non-touch area and does not display an image, and wherein the display device further comprises a feed line electrically connected to the antenna electrode and disposed in the peripheral area.

In an embodiment of the present inventive concept, the display device further including: a first thin film transistor disposed in the first area; a second thin film transistor disposed in the touch area; a first light emitting structure electrically connected to the first thin film transistor; a second light emitting structure electrically connected to the second thin film transistor; and a thin film encapsulation layer configured to cover the first light emitting structure and the second light emitting structure.

In an embodiment of the present inventive concept, the touch electrode is disposed on the thin film encapsulation layer in the touch area, and the antenna electrode is disposed on the thin film encapsulation layer in the first area.

In an embodiment of the present inventive concept, the touch electrode and the antenna electrode are formed on a same layer.

In an embodiment of the present inventive concept, the touch area and the non-touch area form a display area configured to display an image, wherein the display area includes a main display area and an edge display area connected to the main display area and formed in a curved surface of the base substrate, and wherein the non-touch area is positioned in the edge display area.

In an embodiment of the present inventive concept, the display device further includes an inner dummy pattern disposed in the lattice pattern of the antenna electrode.

In an embodiment of the present inventive concept, portions of the inner dummy pattern are separated from each other.

According to an embodiment of the present inventive concept, a display device includes: a base substrate including a touch area and a non-touch area adjacent to the touch area touch electrode disposed in the touch area and including a lattice pattern; an antenna electrode disposed in the non-touch area and including a lattice pattern; a dummy pattern including a lattice pattern and disposed in the non-touch area between the antenna electrode and the touch area; and a plurality of inner dummy patterns disposed in the lattice pattern of the antenna electrode.

In an embodiment of the present inventive concept, the inner dummy patterns are spaced apart from each other.

In an embodiment of the present inventive concept, the inner dummy patterns are disposed in the lattice pattern of the dummy pattern.

According to an embodiment of the present inventive concept, a display device includes: a base substrate including a touch area and a non-touch area adjacent to the touch area; a touch electrode disposed in the touch area and including a lattice pattern; an antenna electrode disposed in the non-touch area and including a lattice pattern; and a dummy pattern including a lattice patter and disposed in the non-touch area between the antenna electrode and the touch area, wherein a density of the dummy pattern gradually increases in a direction from the touch area to the antenna electrode.

In an embodiment of the present inventive concept, the touch area and the non-touch area provide a display area configured to display an image, wherein the display area includes a main display area and an edge display area connected to the main display area and formed in a curved surface of the base substrate, and wherein the non-touch area is positioned in the edge display, area.

According to an embodiment of the present inventive concept, a display device includes: base substrate including a touch area and a non-touch area adjacent to the touch area and including a first area and a second area; a touch electrode disposed in the touch area and including a lattice pattern; an antenna electrode disposed in the first area and including a lattice pattern; a first dummy pattern disposed in the first area and separated from the antenna electrode wherein the first dummy pattern includes a lattice pattern; and a second dummy pattern disposed in the second area and including a lattice pattern, wherein the first dummy pattern and the second dummy pattern are disposed between the antenna electrode and the touch electrode, and the lattice pattern of the second dummy pattern includes openings that are larger than openings of the lattice pattern of the first dummy pattern.

In an embodiment of the present inventive concept, the display device further includes a third dummy pattern disposed between the second dummy pattern and the touch electrode, and including a lattice pattern with openings larger than the openings of the lattice pattern of the second dummy pattern.

In ail embodiment of the present inventive concept, the display device further includes an inner dummy pattern disposed in the lattice pattern of the antenna electrode and the lattice pattern of the first dummy pattern.

BRIEF DESCRIPTION OF THE DRAWING

The above and other features of the present inventive concept will become more apparent by describing in detailed embodiments thereof with reference to the accompanying drawings, in which.

DETAILED DESCRIPTION OF THE EMBODIMENTS

Hereinafter, embodiments of the present inventive concept will be explained in detail with reference to the accompanying drawings.

Figure 1:
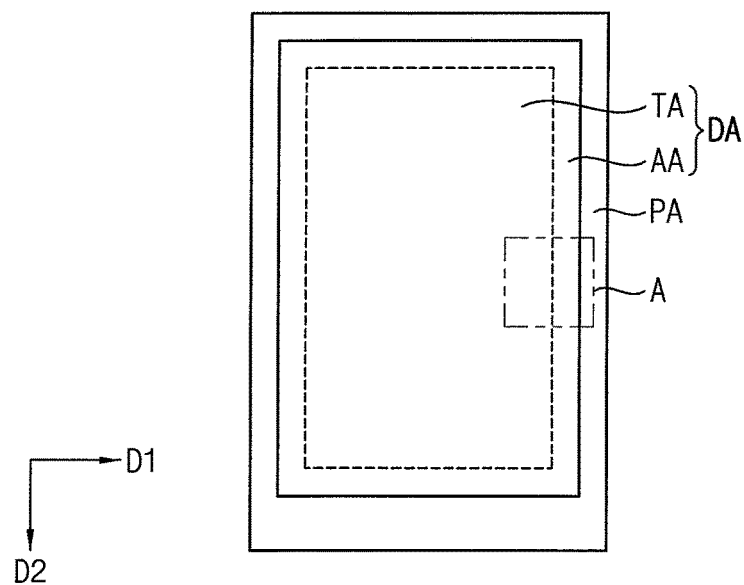
FIG. 1 is a plan diagram illustrating a display device according to an embodiment of the present inventive concept.

FIG. 1 is a plan diagram illustrating a display device according to an embodiment of the present inventive concept.

Referring to FIG. 1, the display device may include a display area DA and a peripheral area PA that is a non-display area and is adjacent to the display area DA.

The display area DA is an area configured to display an image, and may be disposed on a plane provided by a first direction D1 and a second direction D2 substantially perpendicular to the first direction D1.

The display device may include a plurality of pixels for displaying the image in the display area DA. For example, the display device may include n*m pixels positioned at intersections between scan lines extending in the first direction D1 and data lines extending in the second direction D2 (where, n and in are integers greater than 1). Various known structures may be applied to a structure for the pixels.

The display area DA may include a touch area TA and a non-touch area AA surrounding the touch area TA. A touch electrode (see TE FIG. 5) may be disposed in the touch area. TA so that a touch input of a user may be detected. The touch electrode may not be formed in the non-touch area AA.

The peripheral area. PA may at least partially surround the display area DA and may not display the image. In this case, circuits and wirings for driving pixels of the display area DA may be disposed in the peripheral area PA.

Figure 2:
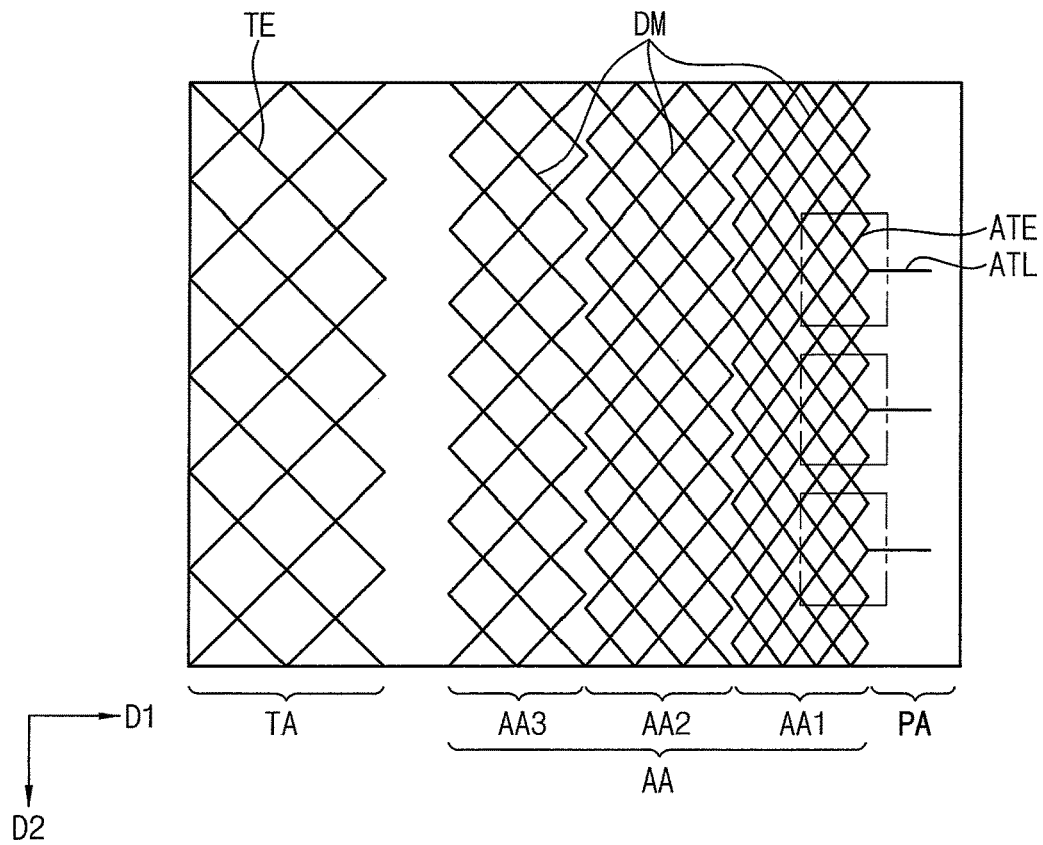
FIG. 2 is an enlarged diagram illustrating a portion A in the display device of FIG. 1.
Figure 3:
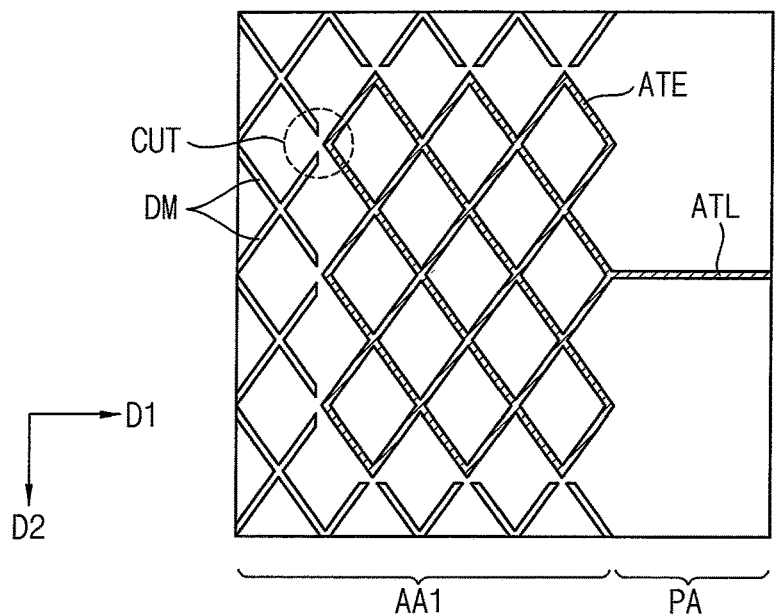
FIG. 3 is an enlarged diagram illustrating an antenna electrode in the display device of FIG. 2.
Figure 4:
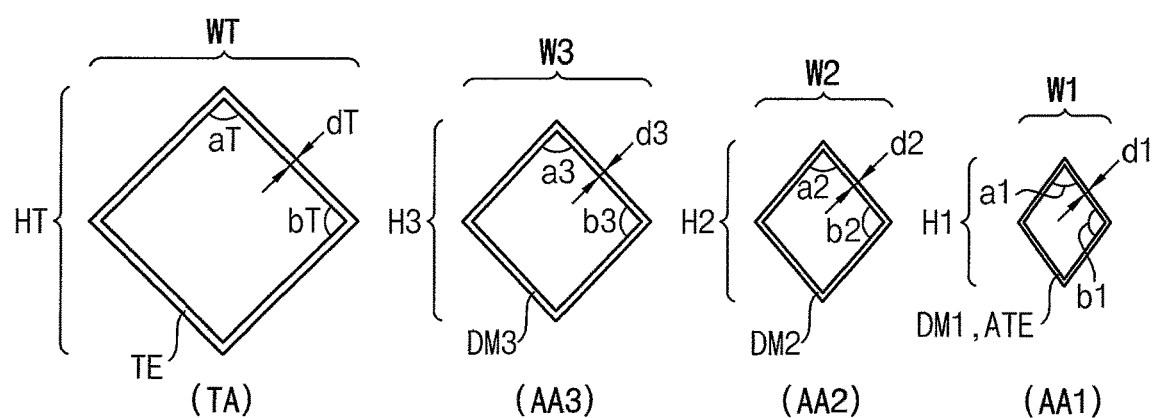
FIG. 4 is a diagram illustrating a shape of a lattice pattern in a touch area, a shape of a lattice pattern in a third area, a shape of a lattice pattern in a second area, and a shape of a lattice pattern in a first area in the display device of FIG. 2.

FIG. 2 is an enlarged diagram illustrating a portion A in the display device of FIG. 1, FIG. 3 is an enlarged diagram illustrating an antenna electrode in the display device of FIG. 2, and FIG. 4 is a diagram illustrating a shape of a lattice pattern in a touch area, a shape of a lattice pattern in a third area, a shape of a lattice pattern in a second area, and a shape of a lattice pattern in a first area in the display device of FIG. 2.

Referring to FIGS. 1 to 4, the display device may include a touch area TA, a non-touch area AA, and a peripheral area PA The non-touch area AA may include a first area AA1, a second area AA2, and a third area AA3. The first area AA1, the second area AA2, and the third area AA3 may be sequentially disposed from the peripheral area PA to the touch area TA. In other words, the first area AA1 may be disposed between the peripheral area PA and the second area AA2, the second area AA2 may be disposed between the first area AA1 and the third area AA3, and the third area AA3 may be disposed between the second area AA2 and the touch area TA.

An antenna electrode ATE and a first dummy pattern DL 1 may be disposed in the first area AA1. The antenna electrode ATE may be used for a communication function, and may be connected to a feed line ATL disposed in the peripheral area PA. The feed line AIL may be connected to external antenna driving unit through an external connection electrode disposed in the peripheral area PA, or electrically connected to an antenna driving unit disposed in the peripheral area PA.

The antenna electrode ATE may include a lattice pattern. For example, the lattice pattern may include a quadrangular shape having four sides having substantially the same length. For example, the lattice pattern may have a plurality of rhombus shapes arranged along a first direction. D1 and a second direction D2 substantially perpendicular to the first direction D1. For example, the lattice pattern may have a long rhombus shape in the longitudinal direction D2. For example, the rhombus shape of the lattice pattern may have a length that is different from its width.

The rhombus shape may have a first height H1 and a first width W1, and may have a first line width d1. For example, the first width ay be about 130 μm (micrometer), the first height H1 may be about 260 μm, and the first line width d1 may be about 1 μm to about 2.5 μm.

The quadrangular shape of the lattice pattern of the antenna electrode ATE may form a vertex angle a1 smaller than 90 degrees. For example, the vertex angle may be about 53 degrees. The quadrangular shape may have another vertex angle hi that may be about 127 degrees.

A plurality of antenna electrodes ATE may be spaced apart from each other. In this case, beam-firming may be implemented by changing a phase of a signal applied to each antenna electrode.

The feed line ATL may be electrically connected to the antenna electrode ATE. The feed line ATL may be electrically connected to the antenna driving unit.

The antenna driving unit may perform transmitting and receiving communication functions by transmitting an electrical signal to the antenna electrode ATE, or receiving an electrical signal from the antenna electrode ATE.

For example, the antenna driving unit may include a radio frequency integrated circuit (RFIC) configured to feed power to the antenna electrode ATE. The RFIC may include a high power amplifier (HPA) and a low noise amplifier (LNA). A transmission signal may be transmitted through the high power amplifier (HPA) and to the antenna electrode ATE. The transmission signal may be radiated via the antenna electrode ATE, and a reception signal received via the antenna electrode may be amplified by the low noise amplifier (LNA).

Since the first dummy pattern DM1 is disposed adjacent to the antenna electrode ATE, the first dummy pattern DM1 may have the same lattice pattern shape as the antenna electrode ATE. For example, the lattice pattern of the antenna electrode ATE may be smaller than or the same as the lattice pattern of the first dummy pattern DM1.

The first dummy pattern DM1 may be spaced apart from the antenna electrode ATE. For example, the lattice pattern may be continuous in the first area AA1 and may have a shape cut at an edge of the antenna electrode ATE (see CUT in FIG. 3). In addition, a plurality of cut portions may be formed inside the first dummy pattern DM1.

A first quadrangular shape of the lattice pattern of the first dummy pattern DM1 may have a vertexes smaller than 90 degrees. For example, the first quadrangular shape may be formed with a first vertex angle a1 greater than or equal to the first vertex angle a1 of the antenna electrode ATE.

The first dummy pattern DM1 may have a first line width w1. The line width of the lattice pattern of the antenna electrode ATE may be smaller than or equal to the first line width w1 of the antenna electrode ATE.

The first dummy pattern DM1 may change in size and shape even within the first area AA1. For example, as the first dummy pattern DM1 becomes closer to the second area AA2, the size of the lattice pattern may increase, an angle of the first vertex may increase, and the first line width may gradually increase. For example, portions of the first dummy pattern DM1 that are closest to the second area AA2 may have a larger size, first vertex angle, and first line width than that of portions of the first dummy pattern DM1 furthest from the second area AA2. For example, the openings in the lattice pattern of the first dummy pattern DM1 may become larger.

A second dummy pattern DM2 may be disposed in the second area AA2.

The second dummy pattern DM2 may include a lattice pattern having a size or shape different from the size or shape of the lattice pattern of the first dummy pattern DM1. For example, the lattice pattern may include a quadrangular shape having four sides having the same length. In other words, the lattice pattern may have a plurality of rhombus shapes arranged along the first direction D1 and the second direction D2. For example, the lattice pattern may have a long rhombus shape in the longitudinal direction D2. The rhombus shape may have a second height H2 greater than the first height H1 and a second width W2 greater than the first width W1 of the quadrangular shape of the first dummy pattern DM1.

For example, the first quadrangular shape of the lattice pattern of the second dummy pattern DM2 may include vertexes smaller than 90 degrees, and may be formed with a second vertex angle a2 greater than the first vertex angle a1 of the first dummy pattern DM1. The second dummy pattern DM2 may have a second line width d2 greater than the first line width d1 of the first dummy pattern DM1.

The second dummy pattern DM2 may change in size and shape even within the second area AA2. For example, as the second dummy pattern DM2 becomes closer to the third area AA3, the size of the lattice pattern may increase, an angle of the second vertex may increase, and the second line width may gradually increase.

A third dummy pattern DM3 may be disposed in the third area AA3.

The third dummy pattern DM3 may include a lattice pattern having a size or shape different from the size or shape of the lattice pattern of the second dummy pattern DM2. For example, the lattice pattern may include a quadrangular shape having four sides having the same length. For example, the lattice pattern may have a plurality of rhombus shapes arranged along the first direction D1 and the second direction D2. For example, the lattice pattern may have a long rhombus shape in the longitudinal direction D2. The rhombus shape may have a third height H3 greater than the second height H2 of the second dummy pattern DM2 and a third width W3 greater than the second width W2 of the second dummy pattern DM2.

For example, a third quadrangular shape of the lattice pattern of the third dummy pattern DM3 may include vertexes smaller than 90 degrees, and may be formed with a third vertex angle a3 greater than the second vertex angle a2 of the second dummy pattern DM2. The third dummy pattern DM3 may have a third line width d3 greater than the second line width d2 of the second dummy pattern DM2.

The third dummy pattern DM3 may change in size and shape even within the third area AA3. For example, as the third dummy pattern DM3 becomes closer to the touch area TA, the size of the lattice pattern may increase, an angle of the third vertex may increase, and the third line width may gradually increase.

The touch electrode TE may be disposed in the touch area TA. The touch electrode TE may include a lattice pattern having a size or shape different from the size or shape of the lattice pattern of the third dummy pattern DM3. For example, the lattice pattern may be formed from quadrangular shapes. For example, the quadrangular is disposed in the shape of a rhombus, and may have a size of about 3.9 mm in a diagonal direction.

For example, the lattice pattern of the touch electrode TE may be greater than or equal to the lattice pattern of the third dummy pattern DM3. A line width dT of the lattice pattern of the touch electrode TE may be greater than or equal to the third line width w3 of the third dummy pattern DM3.

In other words, the size of the lattice pattern may increase from the first area AA1 to the third area AA3, and the dummy pattern DM, which has a lattice pattern having a size that gradually changes, may be disposed between the antenna electrodes ATE of a lattice pattern having a very small size as compared to the lattice pattern of the touch electrode TE. In addition, in an embodiment of the present inventive concept, a density of the dummy pattern DM may gradually increase in a direction from the touch area TA to the antenna electrode ATE. In addition, the dummy pattern DM may be disposed to have a shape gradually increasing in a direction from the antenna electrode ATE to the touch area TA. Accordingly, a problem that a stain is visually recognized by the user due to a difference in sizes between the lattice patterns of the touch electrode TE and the antenna electrode ATE may be solved (or, e.g., alleviated).

In addition, from the first area AA1 to the third area AA3, only the size and shape of the lattice pattern may change and the line width may be the same, or only the size may changes and the shape and the line width may be the same.

Figure 5:
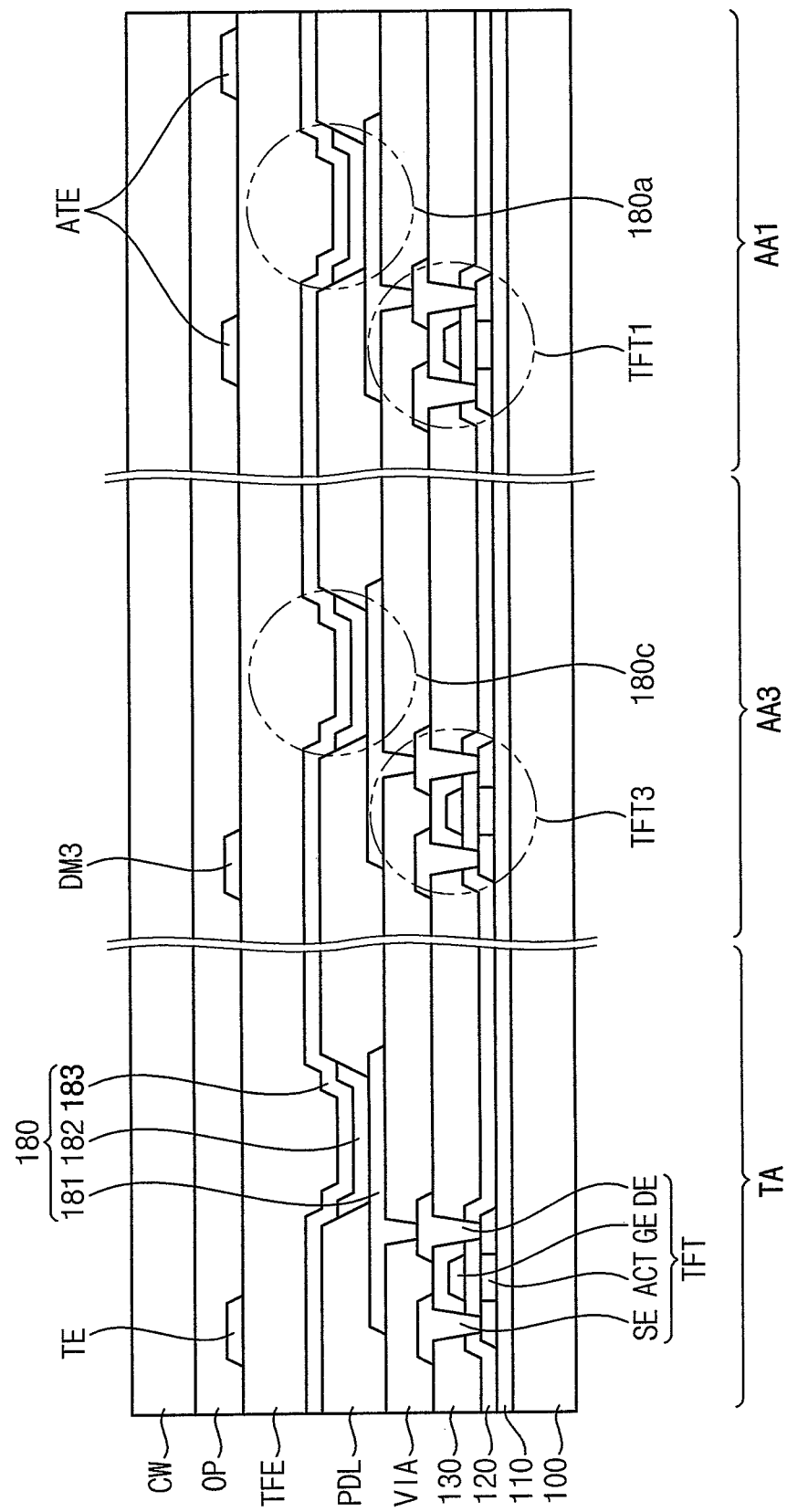
FIG. 5 is a cross-sectional diagram illustrating a touch area, a third area, and a first area in the display device of FIG. 2.

FIG. 5 is a cross-sectional diagram illustrating a touch area, a third area, and a first area in the display device of FIG. 2.

Referring to FIG. 5, the display device may include a base substrate 100, a buffer layer 110, thin film transistors TFT, TFT and TFT3, a first insulating layer 120, a second insulating layer 130, a via insulating layer VIA, a light emitting structure 180 (e.g., a fourth light emitting structure), a first light emitting structure 180a, a third light emitting structure 180c, a thin film encapsulation layer TFE, a touch electrode TE, a third dummy pattern DM3, an antenna electrode ATE, an optical layer OP, and a cover window CW.

The base substrate 100 may include a transparent or opaque material. For example, the base substrate 100 may be a flexible substrate. For example, the base substrate 100 may include a quartz substrate, a synthetic quartz substrate, a calcium fluoride substrate, a fluorine-doped (F-doped) quartz substrate, a soda-lime glass substrate, a non-alkali glass substrate, and the like. Selectively, the base substrate 100 may be formed of a transparent resin substrate. The transparent resin substrate that may be used for the base substrate 100 may include a polyimide substrate as an example. In this case, the polyimide substrate may include a first polyimide layer, a barrier film layer, a second polyimide layer, and the like.

The buffer layer 110 may be disposed on the base substrate 100. The buffer layer 110 may prevent metal atoms or impurities from being diffused from the base substrate 100 to the thin film transistors TFT1, TFT2 and TFT3, and may control the rate of heat transfer, such that the active pattern ACT is substantially uniformly obtained during crystallization process for forming an active pattern ACT of the thin film transistor. In addition, when a surface of the base substrate 100 is not uniform or is uneven, the buffer layer 110 may improve the flatness of the surface of the base substrate 100. According to a type of the base substrate 100, at least two buffer layers may be provided on the base substrate 100 or the buffer layer 100 may not be disposed thereon. For example, the buffer layer 110 may include an organic material and/or an inorganic material.

The active pattern ACT of the thin film transistor TFT may be disposed on the buffer layer 110. For example, the active pattern ACT may include a metal oxide semiconductor, an inorganic semiconductor (such as amorphous silicon), poly silicon, an organic semiconductor, or the like. The active pattern ACT may have a source area, a drain area and a channel area between the source area and the drain area.

The first insulating layer 120 may be disposed on the active pattern ACT. The first insulating layer 120 may include, for example, a silicon compound, metal oxide, and the like. The first insulating layer 120 may have a multi-layer structure including a plurality of insulating layers. For example, the insulating layers may have different thicknesses or include different materials. However, the present inventive concept is not limited thereto, and for example, the first insulating layer 120 may be a single layer structure.

A gate pattern including a gate electrode GE may be disposed on the first insulating layer 120. The gate pattern may be disposed to overlap the channel area of the active pattern ACT. The gate electrode GE may include, for example, a metal, an alloy, metal nitride, conductive metal oxide, a transparent conductive material, or the like.

The second insulating layer 130 may be disposed on the gate pattern. The second insulating layer 130 may include, for example, a silicon compound, metal oxide, and the like. Selectively, the second insulating layer 130 may have a multi-layer structure including a plurality of insulating layers. For example, the insulating layers may have different thicknesses or include different materials. However, the present inventive concept is not limited thereto, and for example, the second insulating layer 130 may be a single layer structure.

A data pattern including a source electrode SE and a drain electrode DE of the thin film transistor TFT may be disposed on the second insulating layer 130. The source electrode SE may be connected to the source area of the active pattern ACT through a contact hole in the first insulating layer 120 and the second insulating layer 130 formed by removing first portions of the first insulating layer 120 and the second insulating layer 130, and the drain electrode DE may be connected to the drain area of the active pattern ACT through a contact hole in the first insulating layer 120 and the second insulating layer 130 formed by removing second portions of the first insulating layer 120 and the second insulating layer 130. The data pattern may include, for example, a metal, an alloy, a metal nitride, a conductive metal oxide, a transparent conductive material, or the like. The above materials may be used individually or in combination. In an embodiment of the present inventive concept, the data pattern may have a multi-layer structure including a plurality of metal layers. For example, the metal layers may have different thicknesses and/or include different materials.

The thin film transistor TFT may be disposed in the touch area TA, the first thin film transistor TFT1 may be disposed in the first area AA1, and the third thin film transistor TFT3 may be disposed in the third area AA3. Although the thin film transistor TFT has been described as having a top gate structure, the configuration of the present inventive concept is not limited thereto. For example, the thin film transistor TFT may have a bottom gate structure, a double gate structure, or the like.

The via insulating layer VIA may be disposed on the second insulating layer 130 and the data pattern. For example, the via insulating layer VIA may be disposed to have a relatively thick thickness. In this case, the via insulation layer VIA may have a substantially planar upper surface. To implement the planar upper surface of the via insulation layer VIA as described above, a planarization process may be added to the via insulation layer VIA. Selectively, the via insulating layer VIA may be disposed to have a substantially uniform thickness along a profile of the data pattern on the second insulating layer 130. The via insulating layer VIA may be formed of, for example, an organic material or an inorganic material. In an embodiment of the present inventive concept, the via insulating layer VIA may include an organic material. For example, the via insulating layer VIA may include photoresist, polyacrylic-based resin, polyimide-based resin, polyamide-based resin, siloxane-based resin, acryl-based resin, epoxy-based resin, and the like.

A first electrode 181 may be disposed on the via insulating layer VIA. The first electrode 181 may be electrically connected to the thin film transistor TFT through a contact hole in the via insulating layer VIA formed by removing a part of the via insulating layer VIA. The first electrode 181 may include, for example, a metal, an alloy, metal nitride, conductive metal oxide, a transparent conductive material, or the like. The above materials may be used individually or in combination. In an embodiment of the present inventive concept, the first electrode 181 may have a multi-layer structure including a plurality of metal layers. For example, the metal layers may have different thicknesses or include different materials. However, the present inventive concept is not limited thereto. For example, the first electrode 181 may be a single layer structure.

The pixel defining layer PDL may be disposed on the via insulating layer VIA. For example, the pixel defining layer PDL may include an opening that may expose a part of the upper surface of the first electrode 181 while covering both side portions of the first electrode 181. The pixel defining layer PDL may be formed of an organic material or an inorganic material. In an embodiment of the present inventive concept, the pixel defining layer PDL may include an organic material.

The light emitting layer 182 may be disposed on the pixel defining layer PDL and the first electrode 181. The light emitting layer 182 may be formed using light emitting materials capable of emitting a color of light (such as red light, green light, and blue light), and each sub-pixel including the light emitting materials may emit a red light, a green light or a blue light. In addition, the light emitting layer 182 may be formed by laminating a plurality of light emitting materials capable of generating different color light such as red light, green light and blue light, such that white light may be emitted. In this case, a color filter may be disposed on the light emitting layer 182 disposed on the first electrode 181. The color filter may include at least one of a red color filter, a green color filter, or a blue color filter. Selectively, the color filter also may include a yellow color filter, a cyan color filter, and a magenta color filter. The color filter may include photosensitive resin or color photoresist.

A second electrode 183 may be disposed on the light emitting layer 182 and the pixel defining layer PDL. The second electrode 183 may include, for example, a metal, an alloy, metal nitride, conductive metal oxide, a transparent conductive material, or the like. The above materials may be used individually or in combination. In an embodiment of the present inventive concept, the second electrode 183 may have a multi-layer structure including a plurality of layers. For example, the metal layers may have different thicknesses and/or include different materials. However, the present inventive concept is not limited thereto, and for example, the second electrode 182 may be a single layer structure.

The light emitting structure 180 may be disposed in the touch area TA, the first light emitting structure 180*a* may be disposed in the first area AA1, and the third light emitting structure 180*c* may be disposed in the third area AA3.

The thin film encapsulation layer TFE may be disposed to cover the light emitting structure 180, the first light emitting structure 180a, and the third light emitting structure 180c. The thin film encapsulation layer TFE may include at least one inorganic layer and organic layer that are alternately laminated. For example, the thin film encapsulation layer TFE may include a first inorganic layer, an organic layer on the first inorganic layer, and a second inorganic layer on the organic layer. The thin film encapsulation layer TFE may prevent the light emitting layer 182 from deteriorating due to permeation of moisture, oxygen, or the like. In addition, the thin film encapsulation layer TFE may also function to protect an internal structure from an external shock. In addition, the thin film encapsulation layer TFE may increase the flatness.

The touch electrode TE, the third dummy pattern DM3, and the antenna electrode ATE may be disposed on the thin film encapsulation layer TFE.

The antenna electrode ATE, the third dummy pattern DM3, and the touch electrode TE may each be formed of, for example, silver (Ag), aluminum, copper, or an alloy. In an embodiment of the present inventive concept, the antenna electrode ATE, the third dummy pattern DM3, and the touch electrode TE may be formed as a transparent conductive layer.

The optical layer OP may be disposed on the thin film encapsulation layer TFE, on which the antenna electrode ATE, the third dummy pattern DM3, and the touch electrode TE, are disposed. For example, the optical layer OP may be a polarizer configured to reduce external light reflection. The optical layer OP may be implemented in the form of a film, and may be bonded onto the antenna layer by using a pressure sensitive adhesive (PSA).

The cover window CW may be disposed on the optical layer OP. The cover window CW may be bonded onto the optical layer OP by using an adhesive film. The cover window CW may constitute a part of an outer surface of the electronic apparatus (such as a smart phone) including the display device.

Although the second dummy pattern disposed in the second area and the first dummy pattern disposed in the first area are not illustrated in FIG. 5, the first and second dummy patterns may be configured to have a sectional shape similar to the third dummy pattern DM3 disposed in the third area AA3, so the detailed description therefor may be omitted.

Figure 6:
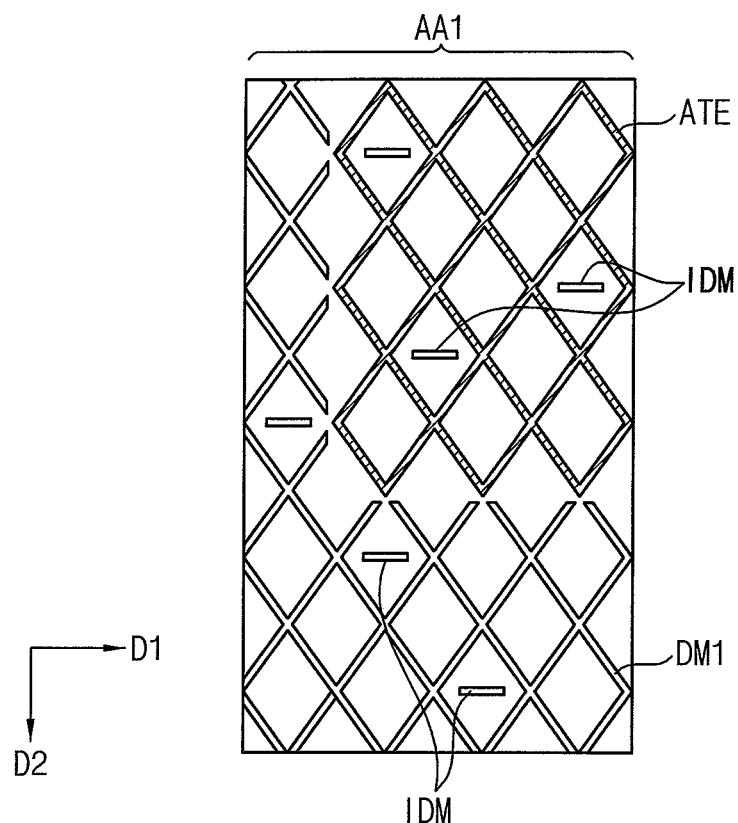
FIG. 6 is an enlarged diagram illustrating an antenna electrode in a display device according to an embodiment of the present inventive concept.

FIG. 6 is an enlarged diagram illustrating an antenna electrode in a display device according to an embodiment of the present inventive concept, and FIGS. 7A to 7H are diagrams illustrating examples of internal dummy patterns formed on an antenna electrode and a dummy pattern in a display device according to an embodiment of the present inventive concept.

Referring to FIG. 6, the display device is substantially the same as the display device of FIGS. 1 to 5 except that the inner dummy patterns IDM are disposed in the lattice pattern. For example, the inner dummy patterns IDM may be positioned in predetermined locations in the lattice pattern. Therefore, duplicate descriptions may be omitted.

The display device may include the antenna electrode ATE and the dummy pattern DM.

The antenna electrode ATE may be formed directly on the thin film encapsulation layer of the display device (see TFE of FIG. 5) or may be attached in the form of a film. In this case, an interference pattern visible to the user may be formed by a repetitive period of a pixel structure constituting a pixel and a period of the lattice pattern of the antenna electrode ATE and the dummy pattern DM.

When the pixel structure and the lattice pattern overlap each other, high frequency components that are not visible in each pattern of the pixel structure and the lattice pattern may generate a pattern of a low frequency component that is noticeable to the user, thereby forming a moire pattern.

According to the present embodiment, as shown in the drawing, the inner dummy patterns IDM may be disposed in the lattice pattern, thereby exerting an impact to the high frequency components, so that the degree of recognition on the moire pattern may be reduced.

Therefore, according to the present embodiment, although the antenna electrode ATE or the like is formed using a metal mesh, such as silver, having a high reflectance, the degree of recognition on the stain by the user may be lowered due to the gradual size changes of the dummy pattern DM and the arrangement of the inner dummy patterns IDM. For example, the inner dummy patterns IDM may be spaced apart from each other.

FIGS. 7A to 7H show examples of various shapes and arrangements of the inner dummy patterns IDM disposed in the lattice pattern of the antenna electrode ATE or the lattice pattern of the dummy pattern DM. For example, the inner dummy patterns IDM may have shapes different from each other (see IDMa and IDMb in FIG. 7B or 7F).

Figure 7A:
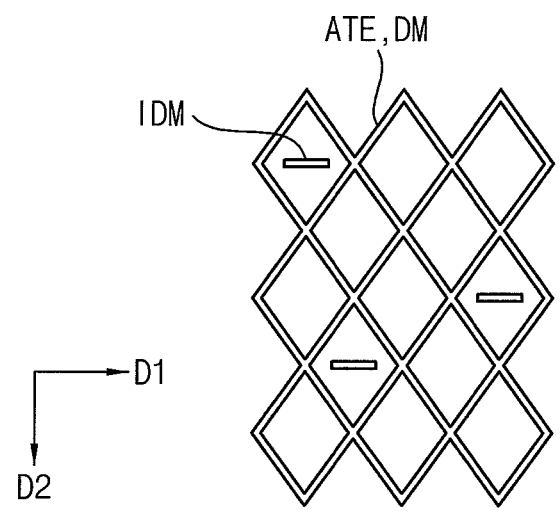
FIGS. 7A, 7B, 7C, 7D, 7E, 7F, 7G and 7H are diagrams illustrating examples of internal dummy patterns formed on an antenna electrode and a dummy pattern in a display device according an embodiment of the present inventive concept.

Referring to FIG. 7A, the inner dummy patterns IDM may extend in the first direction D1 and may be disposed in the lattice pattern of the dummy pattern DM and/or the antenna electrode ATE.

Figure 7B:
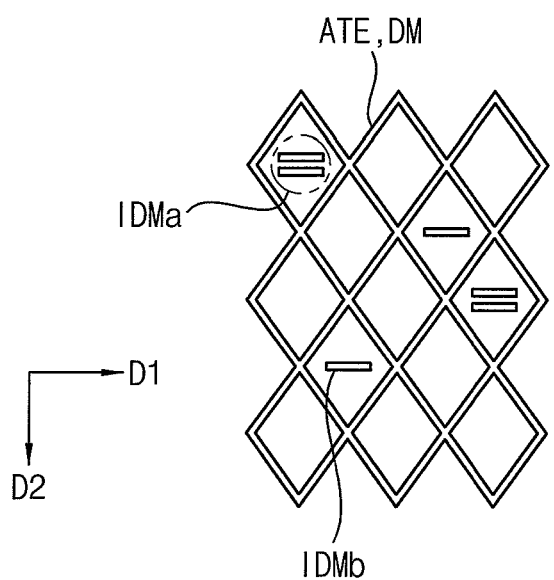

Referring to FIG. 7B, a first inner dummy pattern IDMa and a second inner dummy pattern IDMb may be disposed in the lattice pattern of the dummy pattern DM and/or the antenna electrode ATE, and the first inner dummy pattern IDMa have a shape different from that of the second inner dummy pattern IDMb. For example, the first inner dummy pattern IDMa may have two patterns adjacent to each other extending in the first direction D1, and the second inner dummy pattern IDMb may be a single pattern extending in the first direction D1.

Figure 7C:
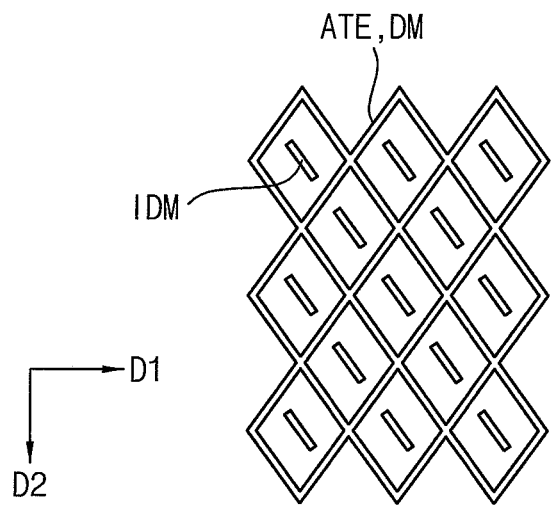
Figure 7D:
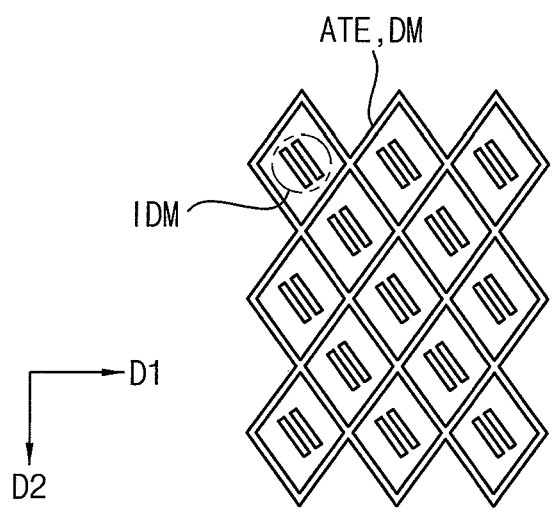
Figure 7E:
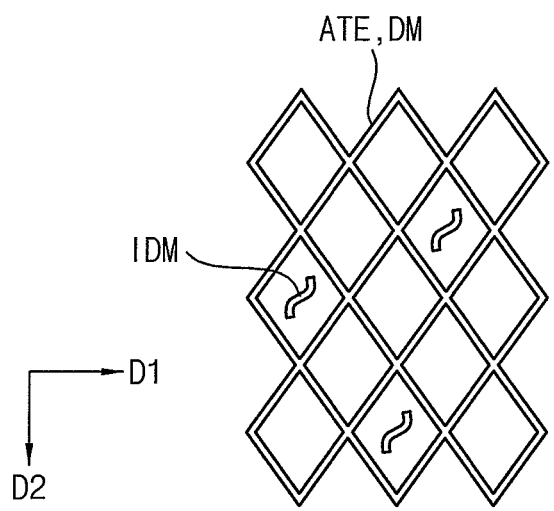
Figure 7F:
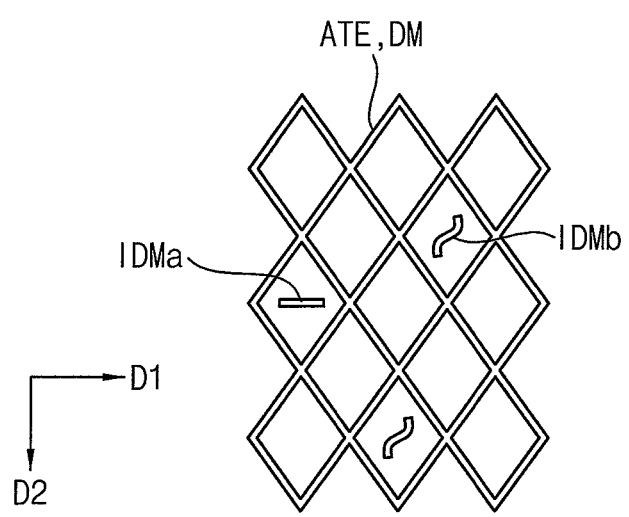
Figure 7G:
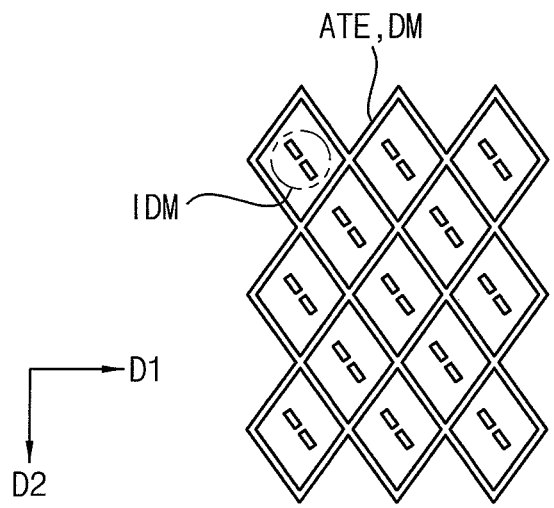
Figure 7H:
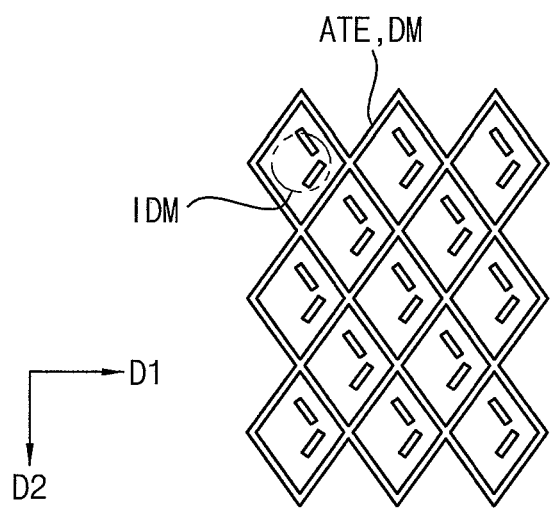

Referring to FIGS. 7C and 7D, the inner dummy pattern IDM may be disposed in the lattice pattern of the dummy pattern DM and/or the antenna electrode ATE and may extend in a direction that crosses the first direction D1 and the second direction D2 (e.g., a diagonal direction). For example, the inner dummy pattern IDM may be disposed in every opening of the lattice pattern of the dummy pattern DM and/or the antenna electrode ATE.

Referring to FIGS. 7E to 7H, the inner dummy patterns IDM may extend in various directions and have various shapes and configurations. For example, the inner dummy patterns IDM may extend in multiple directions and may include gaps or openings.

Figure 8:
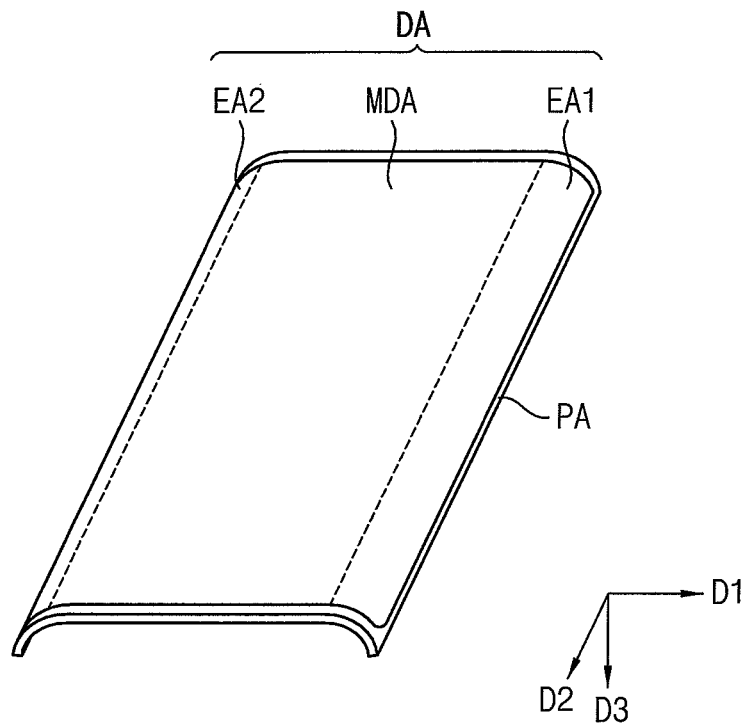
FIG. 8 is a perspective diagram illustrating a display device according to an embodiment of the present inventive concept.
Figure 9:
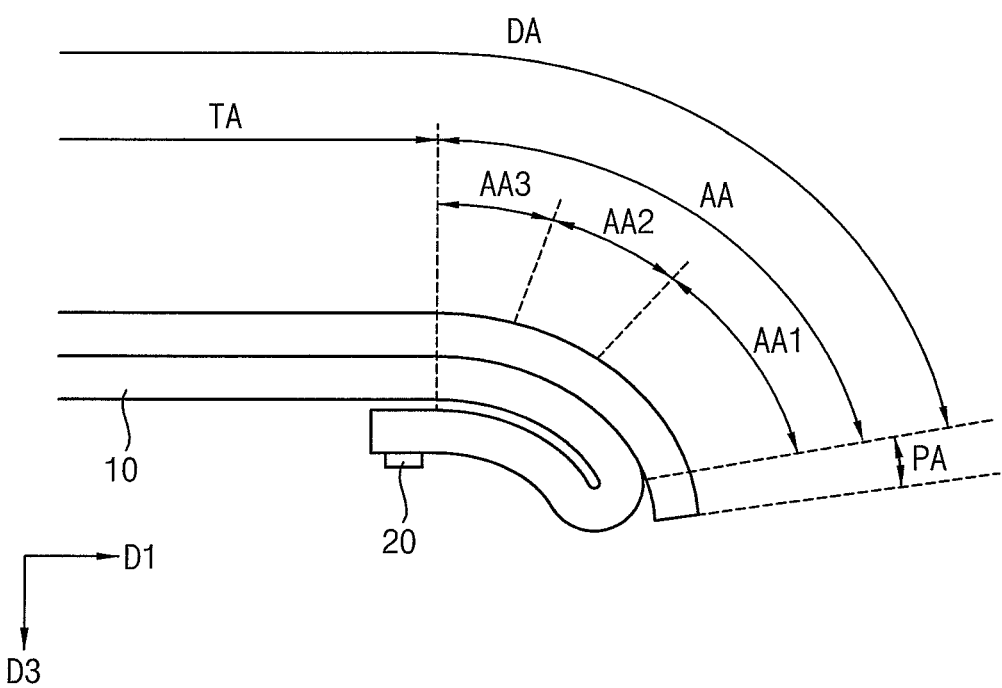
FIG. 9 is a cross-sectional diagram illustrating the display device of FIG. 8.

FIG. 8 is a perspective diagram illustrating a display device according to an embodiment of the present inventive concept, and FIG. 9 is a cross-sectional diagram illustrating the display device of FIG. 8.

Referring to FIGS. 8 and 9 and FIG. 2, the display device may include a display area DA and a peripheral area PA which is a non-display area.

The display area DA may include a main display area MDA and a first edge display area EA1 and a second edge display area EA2 that are adjacent to the main display area MDA. For example, the main display area MDA may have a quadrangular shape extending along a first direction D1 and a second direction D2 substantially perpendicular to the first direction D1. The first edge display area EA1 and the second edge display area EA2 may extend along the second direction D2, and may be connected to right and left sides of the main display area MDA in the first direction D1, respectively. The first edge display area EA1 and the second edge display area EA2 may be bent in a third direction D3 substantially perpendicular to the first and second directions D1 and D2 to form a curved surface. The main display area MDA may be a touch area TA. The first and second edge display areas EA1 and EA2 may include non-touch areas. The non-touch area may include a first area AA1, a second area AA2, and a third area AA3.

An antenna electrode TE may be disposed in the first area AA1. A dummy pattern DM may be disposed in the first area AA to the third area AA3. The touch electrode TE may be disposed in the touch area TA.

As shown in FIG. 9, the peripheral area PA may be bent to be positioned on a rear surface of the first edge display area EA1, and a driving unit 20 configured to drive the display device may be connected to the peripheral area PA. The driving unit 20 may include an RFIC configured to feed power to the antenna electrode TE.

Figure 10:
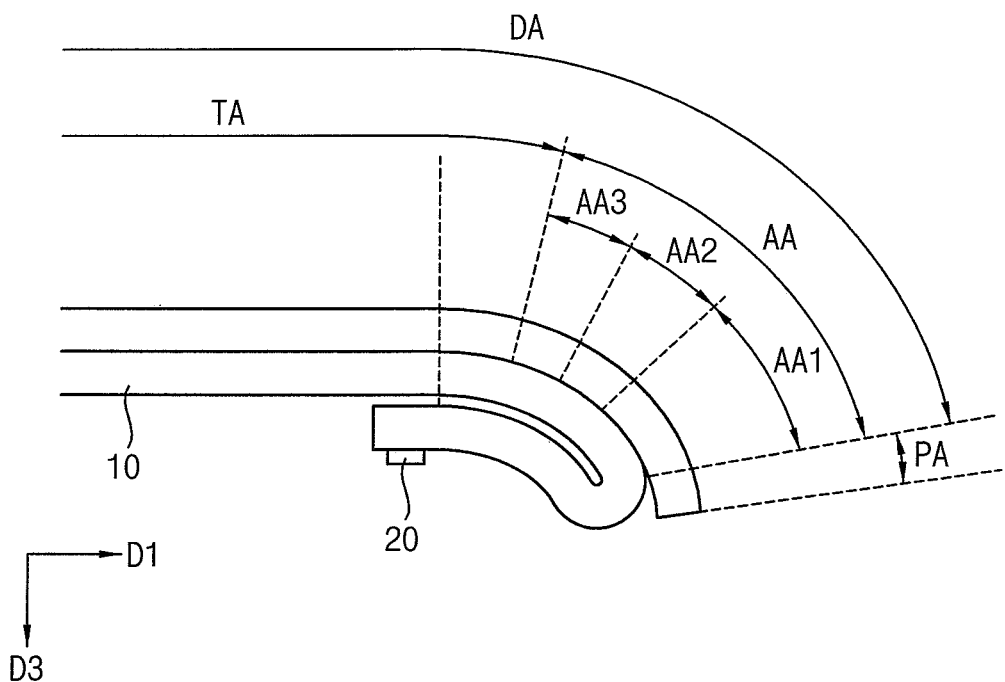
FIG. 10 is a cross-sectional diagram illustrating a display device according to an embodiment of the present inventive concept.

FIG. 10 is a cross-sectional diagram illustrating a display device according to an embodiment of the present inventive concept.

Referring to FIG. 10, the display device is substantially the same as the display devices of FIGS. 8 and 9 except that the touch area TA extends into a part of the curved portion of the display device. Therefore, duplicate descriptions may be omitted.

The touch area TA may extend to a part of the curved portion of the edge display area EA (e.g., EA1 or EA2), and the antenna electrode and the dummy pattern may be disposed in the non-touch area AA.

Figure 11:
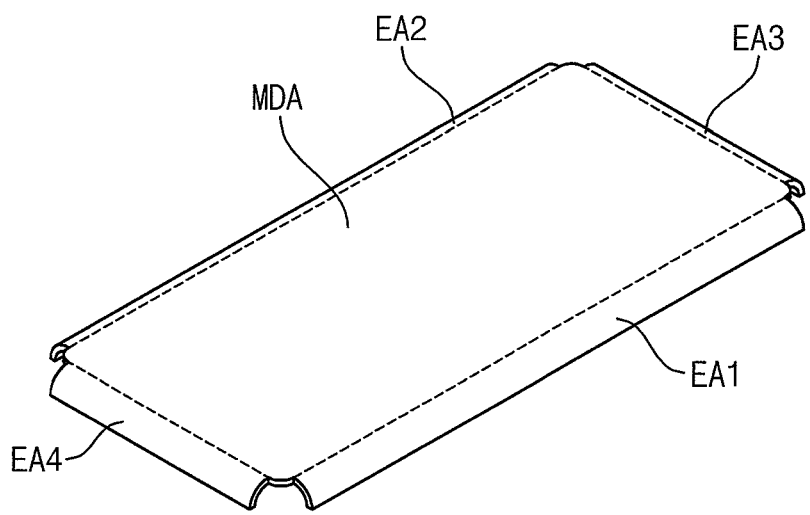
FIG. 11 is a perspective diagram illustrating a display device according to an embodiment of the present inventive concept.

FIG. 11 is a perspective diagram illustrating a display device according to an embodiment of the present inventive concept.

Referring to FIG. 11, the display device is substantially the same as the display devices of FIGS. 8 and 9 except that the display area further includes a third edge area EA3 and a fourth edge area EA4. Therefore, duplicate descriptions may be omitted.

The antenna electrode and the dummy pattern may be formed in at least one of the first to fourth edge areas EA1, EA2, EA3, or EA4. Accordingly, since the antenna electrode may be arranged in several directions, the communication function may be improved.

Figure 12:
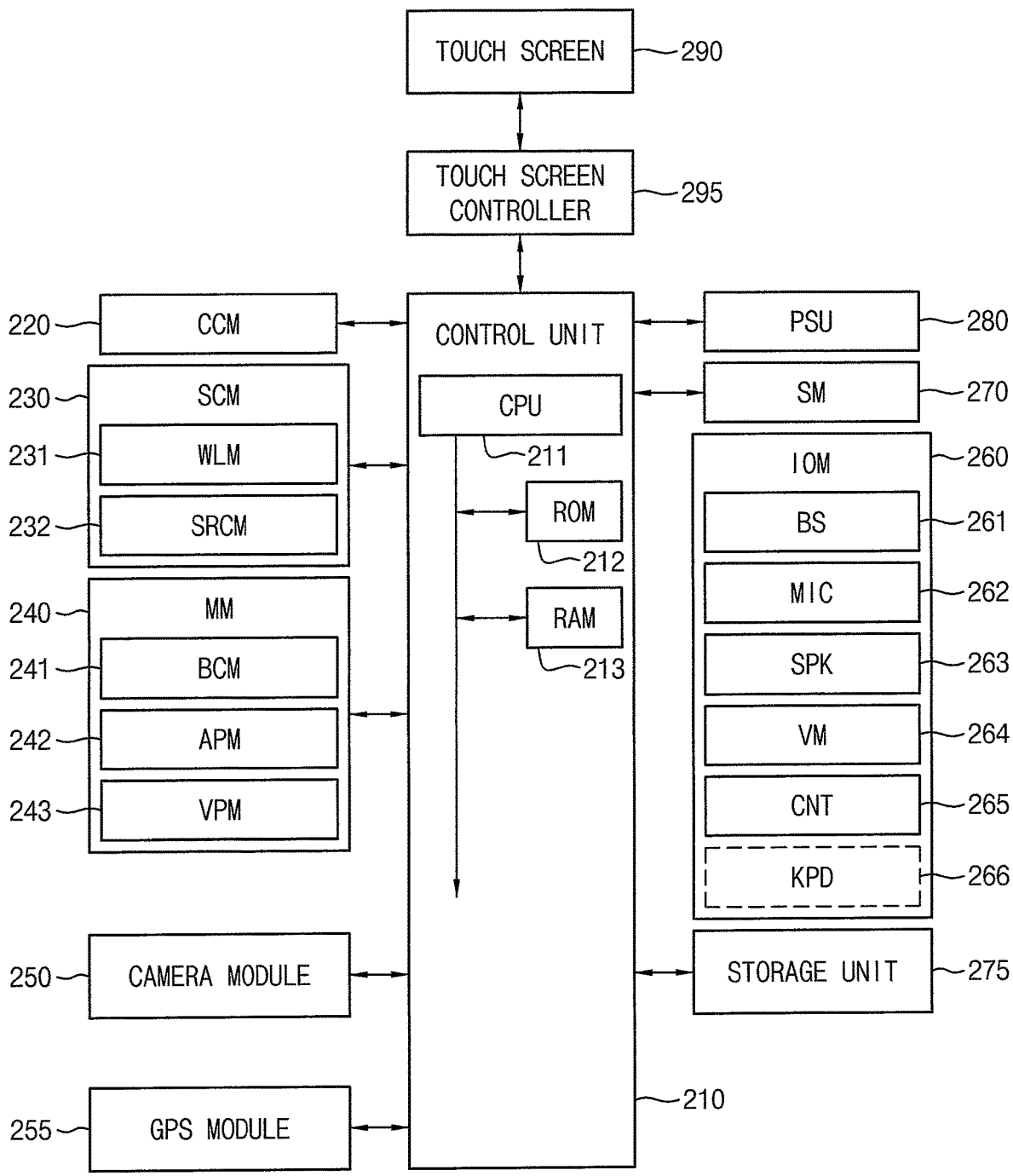
FIG. 12 is a block diagram illustrating a schematic configuration of an electronic apparatus including a display device according to an embodiment of the present inventive concept.

FIG. 12 is a block diagram illustrating a schematic configuration of an electronic apparatus including a display device according to an embodiment of the present inventive concept.

Referring to FIG. 12, the electronic apparatus 200 may be connected to an external device by using at least one of a cellular communication module 220, a sub communication module 230, and a connector 265. The "external device" may include at least one of another device, a mobile phone, a smart phone, a tablet PC, and a computer server.

The electronic apparatus 200 includes a touch screen (or referred to as a touch screen display) 290 and a touch screen controller 295. The touch screen 290 may be the above-described display device according to an embodiment of the present inventive concept. In addition, the electronic apparatus 200 includes a control unit 210, a cellular communication module 220, a sub communication module 230, a multimedia module 240, a camera module 250, a global positioning system (GPS) module 255, an input/output module 260, a sensor module 270, a storage unit 275, and a power supply unit 280. The sub communication module 230 includes at least one of a wireless local area network (LAN) module 231 and/or a short range communication 232, and the multimedia module 240 includes at least one of a broadcast communication module 241, an audio playback module 242, and/or a video playback module 243. The camera module 250 includes a camera, and the input/output module 260 includes at least one of a button set 261, a microphone 262, a speaker 263, a vibration motor 264, a connector 265, and/or a keypad 266.

The control unit 210 includes a central processing unit (CPU) 111, a read-only memory (ROM) 212 in which a control program for controlling the electronic apparatus 200 is stored, and a random access memory (RAM) 213 configured to store signals or data inputted from the outside of the electronic apparatus 200, or be used as a memory area for tasks executed in the electronic apparatus 200. The CPU 211 may include at least one of a single core processor, a dual core processor, a triple core processor, and a quad core processor. The CPU 211, the ROM 212, and the RAM 213 are interconnected through an internal bus.

The control unit 210 controls the cellular communication module 220, the sub communication module 230, the multimedia module 240, the camera module 250, the GPS module 255, the input/output module 260, the sensor module 270, the storage unit 275, the power supply unit 280, the touch screen 290, and the touch screen controller 295.

The cellular communication module 220, under control of the control unit 210, allows the electronic apparatus 200 to be connected to an external device (especially a base station of a cellular system) through at least one antenna or a plurality of antennas by using a wireless access technology according to a cellular communication protocol. For example, the antenna may be disposed on the curved surface of the display device.

The cellular communication module 220 sends/receives wireless signals containing voice calls, video calls, short messaging service (SMS) messages or multimedia messaging service (MMS) messages with other devices capable of communicating, such as a mobile phone, smart phone, tablet PC or other device having phone numbers inputted to the electronic apparatus 200.

The sub communication module 230 may include at least one of the wireless LAN module 231 and the short range communication module 232. For example, the sub communication module 230 may include only the wireless LAN module 231, include only the short range communication module 232, or include both of the wireless LAN module 231 and the short range communication module 232.

The wireless LAN module 231 may be connected to the Internet at a place where a wireless access point (AP) is installed, under the control of the control unit 210. The wireless LAN module 231 supports a wireless LAN standard (IEEE802.11x) of the Institute of Electrical and Electronics Engineers (IEEE).

The short range communication module 232 may wirelessly perform short range communication between the electronic apparatus 200 and the external device, under the control of the control unit 210. The short range communication may include, for example, Bluetooth, infrared data association (IrDA), and the like.

The electronic apparatus 200 may include at least one of the cellular communication module 220, the wireless LAN module 231, and the short range communication module 232 according to performance. For example, the electronic apparatus 200 may include a combination of the cellular communication module 220, the wireless LAN module 231, and the short range communication module 232 according to performance.

The multimedia module 240 may include at least one of the broadcast communication module 241, the audio playback module 242, and/or the video playback module 243. The broadcast communication module 241 may receive a broadcast signal (such as a TV broadcast signal, a radio broadcast signal or a data broadcast signal) and broadcast added information (such as an electric program guide (EPS) or an electric service guide (ESG) that are transmitted from a broadcasting station through a broadcast communication antenna, under the control of the control unit 210. The audio playback module 242 may play a digital audio file (such as a file extension of MPEG Audio Layer-3 (mp3), windows media player (wma), ogg, or waveform audio file format (wav)) stored or received under the control of the control unit 210. The video playback module 243 may play a digital video file (such as a file extension of Moving Picture Experts Group (mpeg), Moving Picture Experts (mpg), MPEG-4 Part 14 (mp4), Audio Video Interleave 2?(avi), mov, or Matroska Video file (mkv)) stored or received under the control of the control unit 210. The video playback module 243 may play a digital audio file.

The multimedia module 240 may include the audio playback module 242 and the video playback module 243 and may not include the broadcast communication module 241. However, in an embodiment of the present inventive concept, the multimedia module 240 may include the broadcast communication module 241. In addition, the audio playback module 242 and/or the video playback module 243 of the multimedia module 240 may be included in the control unit 210.

The camera module 250 may include a camera that photographs a still image or a video under the control of the control unit 210. The camera may be provided in a housing of the electronic apparatus 200 or connected to the electronic apparatus 200 by using a separate connection tool. The camera may include an auxiliary light source (such as a flash) that provides an amount of light for photographing.

The camera module 250 may detect a motion or shape of the user through the camera, and transmit the motion or shape to the control unit 210 as an input for executing or controlling an application.

As an example, the motion of the user may refer to a motion of a hand of the user detected through the camera, and the shape of the user may refer to a shape of a face of the user detected by the camera. In an embodiment of the present inventive concept, the electronic apparatus 200 may detect the motion of the user using another device such as an infrared detector, and execute or control the application in response to the motion.

The GPS module 255 may receive radio waves from a plurality of GPS satellites on earth orbit, and use a time of arrival from the GPS satellites to the electronic apparatus 200 and GPS parameters, so that a location of the electronic apparatus 200 may be calculated.

The input/output module 260 may include at least one of at least one physical button 261, the microphone 262, the speaker 263, the vibration motor 264, the connector 265, and/or the keypad 266. The physical button 261 may be a push type or a touch type formed on a front, side, or rear surface of the housing of the electronic apparatus 200, and may include at least one of a power/lock button, a volume control button, a menu button, a home button, a back button, and a search button. The microphone 262 may receive a voice or sound under the control of the control unit 210 to generate an electrical signal. The speaker 163 may output sounds (such as a wireless signal, a broadcast signal, a digital audio file, a digital video file, or a photo capture), which correspond to various signals of the cellular communication module 220, the sub communication module 230, the multimedia module 240, or the camera module 250, to the outside of the electronic apparatus 200 under the control of the control unit 210. The speaker 263 may output sounds corresponding to a function performed by the electronic apparatus 200 (such as a button operation sound corresponding to a telephone call, or a call connection sound). One or more speakers 263 may be provided at an appropriate location or appropriate locations in the housing of the electronic apparatus 200.

For example, the speaker 263 may include an internal speaker module and/or an external speaker module. The internal speaker module may be disposed at an appropriate position close to an ear of the user during a call, and the external speaker module having a higher output, as compared with the internal speaker, suitable for use in playing audio/video files or watching broadcasts and disposed at an appropriate position in the housing of the electronic apparatus 200.

The vibration motor 264 may convert an electrical signal into mechanical vibration under the control of the control unit 210. For example, when the electronic apparatus 200 in a vibration mode receives a voice call from another device, the vibration motor 264 is operated. One or more vibration motors 264 may be provided in the housing of the electronic apparatus 200. The vibration motor 264 may be operated in response to a user's touch gesture detected on the touch screen 290 and continuous motions of a touch detected on the touch screen 290.

The connector 265 may be used as an interface configured to connect the electronic apparatus 200 to an external device or a power source. Under the control of the control unit 210, data stored in the storage unit 275 of the electronic apparatus 200 may be transferred to the external device through a wired cable connected to the connector 265 or data may be received from the external device. Power may be inputted from the power source or a battery may be charged through the wired cable connected to the connector 265.

The keypad 266 may receive a key input from the user for controlling the electronic apparatus 200. The keypad 266 includes a physical keypad provided in or connected to the electronic apparatus 200 and/or a virtual keypad that may be displayed on the touch screen 290. The physical keypad provided in the electronic apparatus 200 may be excluded according to a performance or structure of the electronic apparatus 200.

The sensor module 270 includes at least one sensor that detects a state of the electronic apparatus 200. For example, the sensor module 270 may include at least one of a proximity sensor configured to detect whether the user approaches the electronic apparatus 200, an ambient light sensor configured to detect an amount of light around the electronic apparatus 200, and a motion sensor configured to detect a motion of the electronic apparatus 200 (such as a rotation of the electronic apparatus 200, an absolute/relative movement of at least one panel constituting the electronic apparatus 200, an acceleration applied to the electronic apparatus 200, or a vibration). Each sensor of the sensor module 270 may detect a state, generate a signal corresponding to the detection, and transmit the signal to the control unit 210. Each sensor of the sensor module 270 may be added or removed according to the performance of the electronic apparatus 200.

The storage unit 275 may store signals, information or data inputted/outputted to correspond to operations of the cellular communication module 220, the sub communication module 230, the multimedia module 240, the camera module 250, the GPS module 255, the input/output module 260, the sensor module 270, and the touch screen 290. The storage unit 275 may store control programs and applications for controlling the electronic apparatus 200 or the control unit 210. Hereinafter, the term "storage unit" may include a memory card (such as an SD card, or a memory stick) that may be detachably mounted to the storage unit 275, the ROM 212, the RAM 213, or the electronic apparatus 200. In addition, the storage unit may include a nonvolatile memory, a volatile memory, a hard disk drive (HDD), or a solid state drive (SSD).

The power supply unit 280 may supply power to one or more batteries disposed in the housing of the electronic apparatus 200 under the control of the control unit 210. The one or more batteries supply the power to the control unit 210 and each component module of the electronic apparatus 200. In addition, the power supply unit 280 may supply the power, which is inputted from the external power source through the wired cable connected to the connector 265, to the electronic apparatus 200.

The touch screen 290 is a display device configured to display various applications (such as a call, data transmission, broadcast, and camera) executable by the control unit 210 and provide user interfaces configured to be adapted to the applications, in which at least one touch gesture may be inputted through a user's body (such as a finger including a thumb) or a detectable input tool (such as a stylus pen). The user interface may include a predetermined touch area, soft key and soft menu. The touch screen 290 may transmit an electronic signal, which corresponds to at least one touch gesture inputted through the user interface, to the touch screen controller 295. In addition, the touch screen 290 may detect continuous motions of the touch, and transmit the electronic signal corresponding to the continuous or discontinuous motions of the touch to the touch screen controller 295. The above-described touch screen 290 may be implemented by, for example, a resistive scheme, a capacitive scheme, an infrared scheme, or an acoustic wave scheme.

The touch screen controller 295 converts the electronic signal received from the touch screen 290, in response to a touch gesture, into a digital signal (for example, X and Y coordinates) and transmits the digital signal to the control unit 210. The control unit 210 may control the touch screen 290 by using the digital signal received from the touch screen controller 295. For example, the control unit 210 may allow a soft key displayed on the touch screen 290 to be selected in response to the touch gesture or execute an application corresponding to the soft key. In addition, the touch screen controller 295 may be included in the control unit 210.

In the specification herein, the touch gesture signifies to include a non-contact (for example, a detectable interval between the touch screen 290 and the user's body or touchable input tool is 1 mm or less), without being limited to direct contact between the touch screen 290 and the user's body or touchable input tool. The detectable interval in the touch screen 290 may be changed according to the performance or structure of the electronic apparatus 200.

In this embodiment, the touch gesture may include all kinds of user gestures that allow the mobile device to be detected upon directly or close proximity to the touch screen 290. For example, the touch gesture denotes a user's motion of selecting one location or a plurality of continuous locations on the touch screen 290 by using fingers (especially index fingers) and thumbs of left and right hands, or an object (such as a stylus pen) detectable by the touch screen 290, and may include a motion such as touch, contact, release of touch, tap, contact and rotation, pinch, spread, and touch drag. The touch drag denotes a gesture of moving a finger or thumb in a constant direction in a state of touching the finger, thumb, or stylus pen on the touch screen 290, and may include, for example, a gesture such as touch and drag, flick, swipe, slide, and sweep. The state of touching on the touch screen 290 may include a state of directly touching the finger, thumb, or stylus pen on the touch screen 290, or closely approaching the touch screen 290 even if the touch screen 290 is not touched.

The electronic apparatus 200 is an apparatus configured to execute an application, a widget, and a function, which are stored in the storage unit and executable by the control unit 210, through the touch screen 290. In general, the touch screen 290 provides graphical objects (that is, e.g., soft keys or shortcut icons) corresponding to applications, widgets, functions, and groups thereof through a home screen, an application menu, or the like. The mobile device executes a corresponding application, widget or function in response to detecting a users touch gesture on each graphic object.

The widget refers to a mini-application that may be downloaded and used by the user or generated by the user. For example, the widget includes a weather widget, a stock widget, a calculator widget, an alarm clock widget, a dictionary widget, and the like. The shortcut icon for executing the widget may provide simple preliminary information through a corresponding widget application. As an example, an icon of the weather widget simply provides a symbol of a current temperature and weather, and a widget application that executed through a touch of the icon provides a greater amount of information, such as weather based on a period/region. In the specification herein, the application includes a widget-based application and a non-widget-based application.

In an embodiment of the present inventive concept, the touch screen 290 may be formed of one panel (or tablet), and display one or more task screens corresponding to one or more applications, under the control of the control unit. In an embodiment of the present inventive concept, the touch screen 290 may be formed of two panels which are physically separated from and connected to each other by a predetermined connecting portion, and the panels may be fold-in or fold-out by a predetermined angle about the connecting portion. The connecting portion may be a hinge, a flexible connecting portion, or a part of a flexible touch screen. In an embodiment of the present inventive concept, the touch screen 290 may be formed of a flexible touch screen that may be bent or folded at least once. The touch screen 290 displays one or more task screens related to one or more applications under the control of the control unit.

An embodiment of the present inventive concept may be applied to a display device and an electronic apparatus including the display device. For example, an embodiment of the present inventive concept may be applied to a smart phone, a cellular phone, a video phone, a smart pad, a smart watch, a tablet PC, a car navigation system, a television, a computer monitor, a laptop, a head mounted display (HMD) device, etc.

While the present inventive concept has been described with reference to embodiments thereof, it will be understood by those of ordinary skill in the art that various changes in form and details may be made thereto without departing from the spirit and scope of the present inventive concept.

What is claimed is:

1. A display device comprising:
   a base substrate including a touch area and a non-touch area adjacent to the touch area;
   a touch electrode disposed in the touch area and including a lattice pattern;
   an antenna electrode disposed in the non-touch area and including a lattice pattern;
   a dummy pattern disposed in the non-touch area between the antenna electrode and the touch area and including a lattice pattern,
   wherein the antenna electrode is spaced apart from the dummy pattern in the non-touch area, and the antenna electrode is spaced apart from the touch electrode, and
   wherein the lattice pattern of the dummy pattern includes openings that are larger than openings of the lattice pattern of the antenna electrode, and the lattice pattern of the touch electrode includes openings that are larger than the openings of the lattice pattern of the dummy pattern.

2. The display device of claim 1, wherein the lattice pattern of the antenna electrode has a first quadrangular shape having four sides of substantially a same length, the lattice pattern of the dummy pattern has a second quadrangular shape having four sides of substantially a same length, and the lattice pattern of the touch electrode has a third quadrangular shape having four sides of substantially a same length.

3. The display device of claim 2, wherein a length of one side of the third quadrangular shape of the lattice pattern of the touch electrode is greater than a length of one side of the second quadrangular shape of the lattice pattern of the dummy pattern, and the length of the one side of the second quadrangular shape of the lattice pattern of the dummy pattern is greater than a length of one side of the first quadrangular shape of the lattice pattern of the antenna electrode.

4. The display device of claim 2, wherein the first quadrangular shape of the lattice pattern of the antenna electrode forms a first vertex angle smaller than about 90 degrees, the second quadrangular shape of the lattice pattern of the dummy pattern forms a second vertex angle smaller than about 90 degrees and greater than or equal to the first vertex angle of the first quadrangular shape, and the third quadrangular shape of the lattice pattern of the touch electrode forms a third vertex angle smaller than about 90 degrees and greater than or equal to the second vertex angle of the second quadrangular shape.

5. The display device of claim 2, wherein a line width of the lattice pattern of the touch electrode is greater than or equal to a line width of the lattice pattern of the dummy pattern, and the line width of the lattice pattern of the dummy pattern is greater than or equal to a line width of the lattice pattern of the antenna electrode.

6. The display device of claim 1, wherein the base substrate further includes a peripheral area adjacent to the non-touch area and does not display an image, and
   wherein the display device further comprises a signal line electrically connected to the antenna electrode and disposed in the peripheral area.

7. The display device of claim 1, further comprising:
   a first thin film transistor disposed in the non-touch area;
   a second thin film transistor disposed in the touch area;
   a first light emitting structure electrically connected to the first thin film transistor,
   a second light emitting structure electrically connected to the second thin film transistor; and
   a thin film encapsulation layer configured to cover the first light emitting structure and the second light emitting structure,
   wherein the touch electrode is disposed on the thin film encapsulation layer in the touch area, and the antenna electrode is disposed on the thin film encapsulation layer in the non-touch area.

8. The display device of claim 7, wherein the touch electrode and the antenna electrode are formed on a same layer.

9. The display device of claim 1, wherein the touch area and the non-touch area form a display area configured to display an image, wherein the display area includes a main display area and an edge display area connected to the main display area and formed in a curved surface of the base substrate, and wherein the non-touch area is positioned in the edge display area.

10. The display device of claim 1, further comprising:
    a plurality of inner dummy patterns disposed in the openings of the lattice pattern of the antenna electrode,
    wherein the inner dummy patterns are spaced apart from each other.

11. The display device of claim 1, further comprising:
    a plurality of inner dummy patterns disposed in the openings of the lattice pattern of the dummy pattern,
    wherein the inner dummy patterns are spaced apart from each other.

12. A display device comprising:
    a base substrate including a touch area and a non-touch area adjacent to the touch area;
    a touch electrode disposed in the touch area and including a lattice pattern;
    an antenna electrode disposed in the non-touch area and including a lattice pattern;
    a dummy pattern disposed in the non-touch area between the antenna electrode and the touch area and including a lattice pattern,
    wherein the antenna electrode is spaced apart from the dummy pattern in the non-touch area, and the antenna electrode is spaced apart from the touch electrode, and
    wherein openings of the lattice pattern of the dummy pattern gradually increases in a direction from the antenna electrode to the touch area.

13. The display device of claim 12, wherein a density of the dummy pattern gradually increases in a direction from the touch area to the antenna electrode.

14. The display device of claim 12, wherein the lattice pattern of the antenna electrode has a first quadrangular shape having four sides of substantially a same length, the lattice pattern of the dummy pattern has a second quadrangular shape having four sides of substantially a same length, and the lattice pattern of the touch electrode has a third quadrangular shape having four sides of substantially a same length.

15. The display device of claim 14, wherein a length of one side of the third quadrangular shape of the lattice pattern of the touch electrode is greater than or equal to a maximum length of one side of the second quadrangular shape of the lattice pattern of the dummy pattern, and a minimum length of the one side of the second quadrangular shape of the lattice pattern of the dummy pattern is greater than or equal to a length of one side of the first quadrangular shape of the lattice pattern of the antenna electrode.

16. The display device of claim 14, wherein the first quadrangular shape of the lattice pattern of the antenna electrode forms a first vertex angle smaller than about 90 degrees, the second quadrangular shape of the lattice pattern of the dummy pattern forms a second vertex angle smaller than about 90 degrees and greater than or equal to the first vertex angle of the first quadrangular shape, and the third quadrangular shape of the lattice pattern of the touch electrode forms a third vertex angle smaller than about 90 degrees and greater than or equal to the second vertex angle of the second quadrangular shape.

17. The display device of claim 14, wherein a line width of the lattice pattern of the touch electrode is greater than or equal to a line width of the lattice pattern of the dummy pattern, and the line width of the lattice pattern of the dummy pattern is greater than or equal to a line width of the lattice pattern of the antenna electrode.

18. The display device of claim 12, wherein the base substrate further includes a peripheral area adjacent to the non-touch area and does not display an image, and
   wherein the display device further comprises a signal line electrically connected to the antenna electrode and disposed in the peripheral area.

19. The display device of claim 12, further comprising:
   a plurality of inner dummy patterns disposed in the openings of the lattice pattern of the antenna electrode,
   wherein the inner dummy patterns are spaced apart from each other.

20. The display device of claim 12, further comprising:
   a plurality of inner dummy patterns disposed in the openings of the lattice pattern of the dummy pattern,
   wherein the inner dummy patterns are spaced apart from each other.

* * * * *